(12) United States Patent
Odaki et al.

(10) Patent No.: US 6,521,915 B2
(45) Date of Patent: Feb. 18, 2003

(54) LIGHT-EMITTING DIODE DEVICE

(75) Inventors: Tsutomu Odaki, Izumizaki-mura (JP); Masutsugu Tasaki, Izumizaki-mura (JP); Akira Ichikawa, Izumizaki-mura (JP); Kazuhisa Takagi, Izumizaki-mura (JP); Kazuaki Hashimoto, Yachiyo (JP)

(73) Assignee: Asahi Rubber Inc., Saitama (JP)

( * ) Notice: Subject to any disclaimer, the term of this patent is extended or adjusted under 35 U.S.C. 154(b) by 40 days.

(21) Appl. No.: 09/805,461

(22) Filed: Mar. 14, 2001

(65) Prior Publication Data

US 2001/0050371 A1 Dec. 13, 2001

(30) Foreign Application Priority Data

Mar. 14, 2000 (JP) .......................................... 2000-070878

(51) Int. Cl.[7] ................................................ H01L 33/00
(52) U.S. Cl. ............................. 257/98; 357/89; 357/90; 357/100
(58) Field of Search .............................. 257/89, 90, 98, 257/100

(56) References Cited

U.S. PATENT DOCUMENTS

| | | | | |
|---|---|---|---|---|
| 3,652,956 A | * | 3/1972 | Pinnow et al. | 252/301.4 R |
| 5,959,316 A | * | 9/1999 | Lowery | 257/100 |
| 6,066,861 A | * | 5/2000 | Hohn et al. | 252/301.36 |
| 6,319,425 B1 | * | 11/2001 | Tasaki et al. | 252/301.36 |

* cited by examiner

*Primary Examiner*—Jerome Jackson

(57) ABSTRACT

An LED device is provided that has an excellent color rendering property and no toxicity and does not increase production costs more than necessary. A covering member is also provided used for such a device. The LED device comprises a light-emitting element for emitting light in a blue to green region and a fluorescent substance containing a red phosphor for converting the wavelength of the light emitted from the light-emitting element to another wavelength. The red phosphor is CaS activated by Eu or a phosphor expressed by the general formula $AEu_{(1-x)}Ln_xB_2O_8$, wherein A is an element selected from the group consisting of Li, K, Na and Ag; Ln is an element selected from the group consisting of Y, La and Gd; and B is W or Mo; and x is number equal to or larger than 0, but smaller than 1.

15 Claims, 10 Drawing Sheets peak @ 458nm peak @ 470nm

LIGHT-EMITTING DIODE DEVICE

FIELD OF THE INVENTION

The present invention relates to a white light-emitting diode device which has an excellent color rendering property and which can be used in a back light and a front light as an externally irradiating light source of a color liquid crystal display and for room illumination. Particularly, the present invention relates to a covering member that enables a conventional blue or green light-emitting diode device to emit white light, and a white light-emitting diode device using the covering member.

DISCUSSION OF THE RELATED ART

A light-emitting diode (hereinafter, referred to as "LED") emits a light when electrons from an N-region and holes from a P-region are moved to a PN junction section and are recoupled in a PN junction semiconductor when a forward voltage is applied. Since the energy released when the free electrons are coupled is radiated as light, the light emitted from the LED is light in a narrow wavelength range, i.e. light of a single color such as red or blue.

On the other hand, a light source for illumination of a color liquid crystal display and for room illumination needs to emit fluorescent light or white light approximate to natural light.

Thus, a full-color LED device has been used as a light source for illumination of the color liquid crystal display and for room illumination. The full-color LED device generates white light by using a combination of a red light-emitting element for emitting red light, a blue light-emitting element for emitting blue light and a green light-emitting element for emitting green light.

However, with a full-color LED device as a light source results in a complicated design, since each of the light-emitting elements in the full-color LED device requires must have an anode terminal and a cathode terminal. Further, a larter space and higher costs are required since a full-color LED device uses three kinds of light-emitting elements. In addition, if one light-emitting element of a full-color LED device is broken, the desired color balance is lost, with the result that the intended color tone may not be obtained. In view of the above situation, many studies are being vigorously undertaken to develop an LED device capable of emitting white color using one kind of light-emitting element. Such an LED device is called a white LED device and is distinguishable from the full-color LED device. Using a white LED device enables a back light or the like to be driven by a simple electric circuit without requiring an inverter circuit and the like, and reduces power consumption. This presents advantages such as reducing the outer configuration of the driving circuit and eliminating electromagnetic noise. Because of such advantages, the white LED device is being developed.

Since a white LED device must generate white light by using only one kind of light-emitting element (single-color), it has been the general practice to use a single-color light-emitting element in combination with a phosphor that can convert the wavelength of light emitted from the light-emitting element to emit light of another color. For example, white LED devices which have a layer containing YAG (yttrium aluminate) phosphor provided on a blue light-emitting element are commercially available.

The YAG phosphor generally emits light in the green to yellow region, depending on the kind of activating element in the YAG. Thus, the red light obtained in a white LED by combining a blue light-emitting element for emitting light having an excitation wavelength of YAG and the YAG phosphor is insufficient. This leads to the problem that matters to be displayed in red look subdued.

To remedy this problem, it has been considered to use a YAG phosphor capable of emitting fluorescent light approximate red light, such as by activating YAG, for example, by substituting Gd at the Y-site of $Y_3Al_5O_{12}$, to activate the YAG phosphor and shift the emission peak toward a longer wavelength, i.e. toward the red side of the spectrum. However, such a method cannot be used to provide a white LED device having an average color rendering evaluation number (Ra) of 85 or larger, the value of Ra being an index as to whether an illuminated object conforms to color perception under a reference light. Although more red light may be obtained by increasing the content of red YAG in the fluorescent layer, the emission intensity of yellowish light emitted from YAG also becomes higher, with the result that an average color rendering evaluation number Ra of 85 or larger cannot be obtained.

As a method of compensating for not only the blue, green and yellow lights, but also the red light in the white LED, the use of a red phosphor has also been considered. However, at present the manganese activated magnesium arsenate phosphor known as a dark red phosphor is not being produced for fluorescent lamps due to its toxicity. Further, since manganese activated magnesium fluoride germanium oxide phosphor is expensive, it is not suitable for the use of a white LED as a back light having the merits of being light-weight and thin and of requiring low power consumption.

The effect of adding red pigment to the fluorescent layer of an LED is also being studied (see, for example, Japanese Unexamined Patent Publication No. (HEI)5-152609). However, since the pigment acts like a light filter in making a specified color stand out by cutting other colors, addition of the pigment results in a reduced luminance of the LED device and, thus, is not suitable for a white LED device aimed at conserving space, costs and power.

SUMMARY OF THE INVENTION

An object of the present invention is to provide, without increasing manufacturing costs more than necessary, an LED device having an excellent color rendering property and a covering member used for such an LED device.

An inventive light-emitting diode comprises a light-emitting element for emitting light in the blue to green region and a fluorescent substance containing a CaS phosphor activated by Eu for converting the wavelength of the light emitted from the light-emitting element to a different wavelength.

Another inventive light-emitting diode device comprises a light-emitting element for emitting light in the blue to green region and a fluorescent substance containing a phosphor expressed by a general formula $AEu_{(1-x)}Ln_xB_2O_8$ for converting the wavelength of the light emitted from the light-emitting element to a different wavelength, wherein A is an element selected from the group consisting of Li, K, Na and Ag; Ln is an element selected from the group consisting of Y, La and Gd; and B is W or Mo; and x is number equal to or larger than 0, but smaller than 1.

An inventive covering member for a light-emitting diode device which includes a light-emitting element sealed by a transparent resin for emitting light in the blue to green region comprises a base polymer and a CaS phosphor activated by Eu.

Another inventive covering member for covering a light-emitting diode device which includes a light-emitting element sealed by a transparent resin for emitting light in the blue to green region comprises a base polymer, and a phosphor expressed by a general formula $AEu_{(1-x)}Ln_xB_2O_8$, wherein A is an element selected from the group consisting of Li, K, Na and Ag; Ln is an element selected from the group consisting of Y, La and Gd; and B is W or Mo; and x is number equal to or larger than 0, but smaller than 1.

The inventive light-emitting diode devices are better in emitting red light than conventional light-emitting diode devices using a light-emitting element that emits light in the blue to green region. Thus, according to the present invention, a white diode device having a color rendering property approximate to that of a fluorescent lamp or of natural light can be provided by containing YAG phosphor in the fluorescent substance.

Further, if the inventive covering member is mounted on a conventional light-emitting diode device, it can be used as the inventive white LED device having an excellent color rendering property.

These and other objects, features and advantages of the present invention will become more apparent upon a reading of the following detailed description and accompanying drawings.

BRIEF DESCRIPTION OF THE DRAWINGS

FIGS. 1A and 1B are diagrams showing a structure of a main portion of an LED device according to a first embodiment of the present invention, wherein FIG. 1A shows a coating-type LED device and FIG. 1B shows a film-type LED device, FIGS. 2A and 2B are diagrams showing a structure of a main portion of an LED device according to a second embodiment of the present invention, wherein FIG. 2A shows a cannonball-shaped LED device and FIG. 2B shows a block-shaped LED device.

DETAILED DESCRIPTION OF THE PREFERRED EMBODIMENTS

Figure 1A:
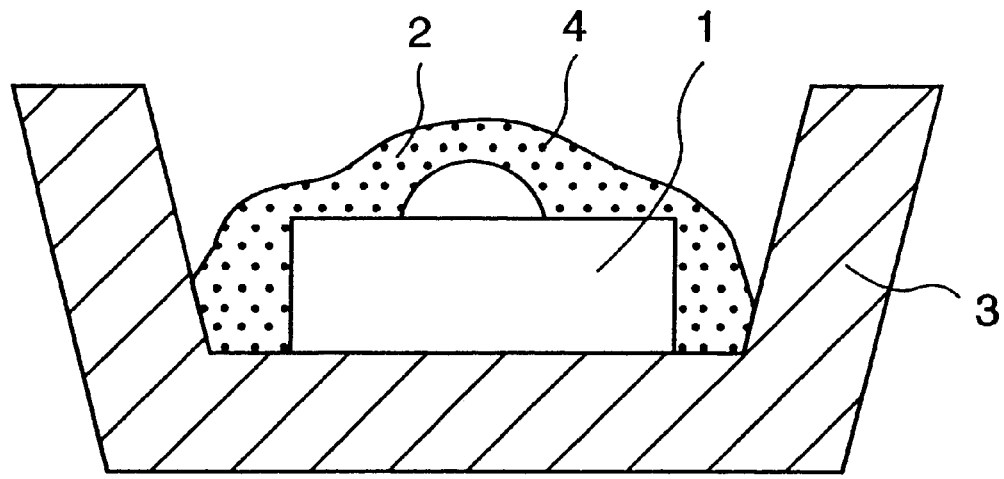

A light-emitting diode device according to the present invention is characterized by using a light-emitting element for emitting light in the blue to green region and a phosphor (hereinafter, referred to as "red phosphor") capable of converting the light emitted from the light-emitting element into a red light.

The light-emitting element used in the present invention is a light-emitting element for emitting light in the blue to green region, specifically blue light of 400 to 600 nm, preferably 400 to 500 nm, and green light of 500 to 600 nm. This is because the red phosphor used in the present invention is excited by these lights as described later.

Blue light-emitting elements include light-emitting diodes containing GaN, SiC, or II–IV groups such as ZnS and ZnSe, and green light-emitting elements include light-emitting diodes containing GaP:N or GaP.

Next, the red phosphor is described.

The red phosphor used in the LED device according to the present invention is CaS activated by Eu or a compound expressed by a general formula $AEu_{(1-x)}Ln_xB_2O_8$ wherein A is an element selected from the group consisting of Li, K, Na and Ag; Ln is an element selected from the group consisting of Y, La and Gd; and B is W or Mo.

CaS activated by Eu is excited by light of 420 to 600 nm and emits light of 570 to 690 nm which peaks at 630 nm.

$AEu_{(1-x)}Ln_xB_2O_8$ is a phosphor which emits light near 614 nm by $^5D_0 \rightarrow {}^7F_2$ transition of $Eu^{3+}$ ions, wherein A is an element selected from the group consisting of Li, K, Na and Ag; Ln is an element selected from the group consisting of Y, La and Gd; and B is W or Mo. Although the excitation wavelength and the emission wavelength vary according to the different elements A and B of the phosphor, the red phosphors are commonly excited by light near 470 nm (blue) and or 540 nm (green) and can emit light near 620 nm (red). It should be noted that the excitation and emission wavelengths are the same, independently of the value of x, if the kinds of the elements A and B are the same in each of the phosphors.

In the general formula $AEu_{(1-x)}Ln_xB_2O_8$ (A=Li, K, Na, Ag; Ln=Y, La, Gd; B=W, Mo), x is equal to or larger than 0 and smaller than 1, and preferably is equal to 0. This is because the emission intensity near 615 nm (red) is highest in the case of $AEuB_2O_8$.

$AEu_{(1-x)}Ln_xB_2O_8$ (A=Li, K, Na, Ag; Ln=Y, La, Gd; B=W, Mo) is obtained by mixing oxides, carbonate and the like of elements which constitute the phosphor at a desired stoichiometric ratio.

By containing the phosphor for emitting red light in the fluorescent substance, an LED device usable as a light source capable of displaying a distinct red color can be provided without using a red light-emitting element.

In addition to the red phosphor, the fluorescent substance may contain other kinds of phosphor for emitting light of a color other than red upon being excited by light from the light-emitting element. It is particularly preferable to contain a phosphor capable of emitting light of a color other than the color light emitted from the light-emitting element and of red light. Specifically, an yttrium aluminate phosphor is preferably used.

The yttrium aluminate phosphor (so-called YAG) is a stable oxide having a garnet structure in which Y-atoms of $Y_3Al_5O_{12}$ are substituted by Gd in some of their positions. Phosphors which are excited by blue light (400 to 530 nm)

to emit light in the yellow to green region centering at approximately 550 nm are particularly stable. Activating elements to be added to the yttrium aluminate phosphor include cerium, europium, manganese, samarium, terbium, tin, chromium, etc. Among them, cerium is preferable. In other words, $Y_xGd_{3-x}Al_5O_{12}$ activated by Ce is preferably used. One, two or more kinds of such YAG phosphors may be contained in the fluorescent substance.

The light emitted from the LED device according to the present invention is a combination of light emitted from the light-emitting element and light having a wavelength converted by the phosphor. The light derived from the phosphor is combined with the light (blue or green) from the light-emitting element, thereby providing light appearing white. A distinct red color, which has been difficult to display using a conventional white LED device, can be displayed by the inventive LED device due to the red phosphor.

Further, by containing the phosphor capable of converting the color of the light from the light-emitting element to a color other than red, a white LED device having an excellent color rendering property and capable of realizing various colors can be provided. Specifically, a white LED device can be provided having an excellent color rendering property: an average color rendering evaluation number Ra of 85 or larger and a special color rendering evaluation number $R_9$, which serves as an index for distinct red, of 80 or larger. Such excellent color rendering property may not be accomplished by changing the kind of YAG, by changing the content of the phosphor and/or by adding pigments to a conventional white LED device.

The color rendering property is a characteristic of a light source related to the influence of an illumination light on how the color of an object looks. The higher the color rendering property, the more the color perception of an object under the light source conforms to that of the same object under a specified reference light. The average color rendering evaluation number Ra is an average of color rendering evaluation numbers for eight specified test colors. The higher the color rendering evaluation number, the better the color rendering property of any given color.

Figure 1B:
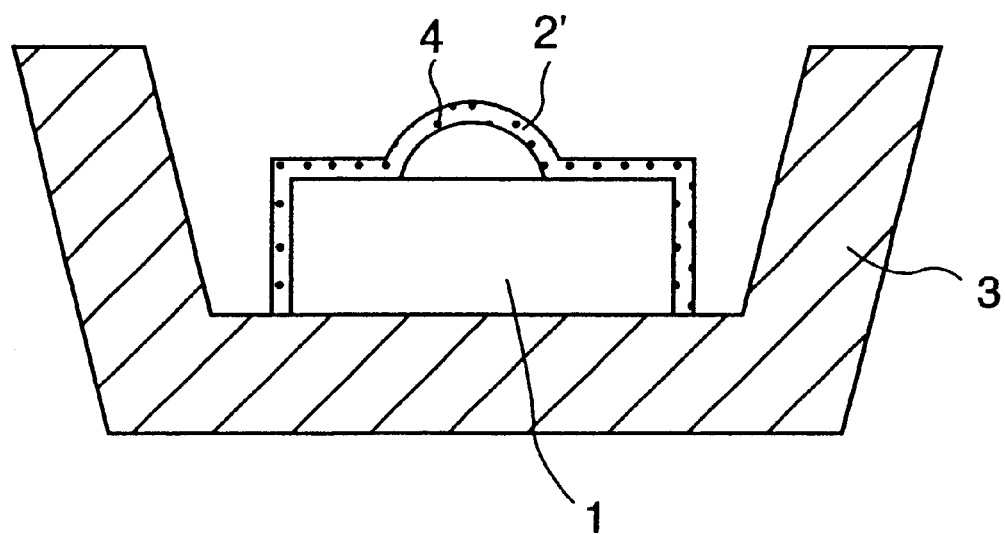

A first embodiment of the LED device according to the invention is such that the fluorescent substance has a form of a layer placed on an outer surface of the light-emitting element. For example, a fluorescent layer 2 may be formed by coating the outer surface of the light-emitting element 1 with a coating agent containing a phosphor 4 as shown in FIG. 1A or a fluorescent layer 2' may be formed by adhering a film made of a resin composition containing the phosphor 4 to the outer surface of the light-emitting element 1 as shown in FIG. 1B. The light-emitting element 1 having the fluorescent layer 2 (or 2') placed thereon may construct a chip-type LED device by being placed in a cup 3 connected with a lead wire (not shown). The chip-type LED device may be sealed with a transparent resin to provide a sealed-type LED device.

The coating agent used for forming the fluorescent layer contains the above-mentioned red phosphor, the YAG phosphor if necessary, binder and solvent. The fluorescent layer 2' is formed by placing a film made from a resin composition comprising the red phosphor and a base resin and adhering the film to the light-emitting element using the binder or by heating the film.

Figure 2A:
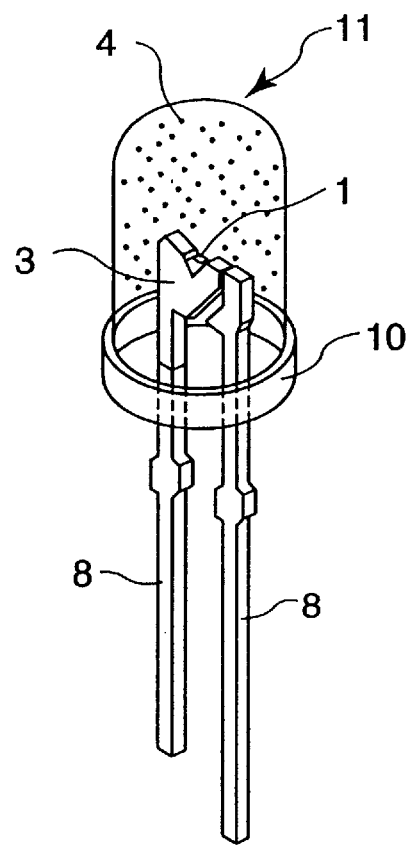
Figure 2B:
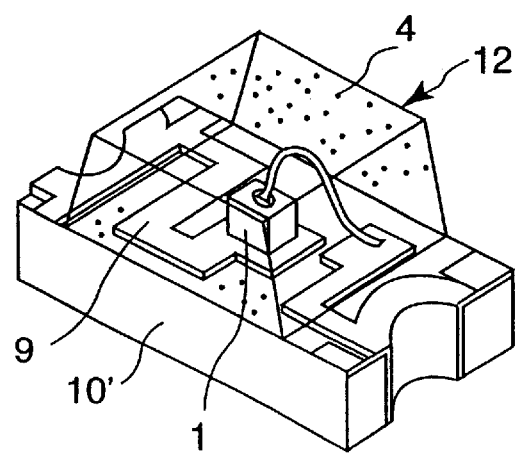

A second embodiment of the LED device according to the present invention is a sealed-type LED such that the light-emitting element is embedded and sealed by a resin containing the red phosphor. One example of the LED device having a cannonball-shape is shown in FIG. 2A. The light-emitting element 1 is placed in the cup 3 connected with a lead frame 8. With this assembly set on a substrate 10 through which the lead frame 8 is insertable, a cannonball-shaped sealed-type LED 11 is formed on the substrate 10 by molding a resin composition containing the red phosphor 4 into a cannonball-shape. The sealed-type LED 11 is formed as to embed the light-emitting element 1 in the fluorescent substance. FIG. 2B shows an example of the LED device having a block-shape. With the light-emitting element 1 placed on a lead wire 9 printed on a substrate 10', a block-shaped sealed-type LED 12 is formed by molding a resin composition containing the red phosphor 4 into a block-shape.

A The resin composition used for sealing the light-emitting element comprises a transparent resin as a base resin and a red phosphor, i.e. CaS activated by Eu or $AEu_{(1-x)}Ln_xB_2O_8$, wherein A is an element selected from the group consisting of Li, K, Na and Ag; Ln is an element selected from the group consisting of Y, La and Gd; and B is W or Mo. The base resin may be a transparent resin having a good property of transmitting the light emitted from the light-emitting element and having durability, chemical resistance and insulating property if desired. Specifically, acrylic resin, polycarbonate, polystyrene, polyester, epoxy resin, polypropylene, polyethylene, silicone resin, etc. can be used as the base resin.

In the resin composition used for sealing the light-emitting element, the content of the red phosphor is preferably 2 to 40 parts by mass with respect to 100 parts by mass of the base resin. In the case of containing YAG in the resin composition, a ratio of the content of YAG to that of the red phosphor (YAG: red phosphor) is preferably 1:0.2 to 1:4.

In the second embodiment, the shape of the sealed-type LED is not limited to the cannonball shape and the block shape. The construction of a terminal to be connected with the light-emitting element is not limited, either.

When the phosphor is contained in the material used for sealing the light-emitting element as in the second embodiment, it is easier to obtain a white LED device having a stable color tone than it is in the first embodiment. This is because the light-emitting element in the second embodiment is very small and only a very small amount of phosphor is contained in the fluorescent layer on its outer surface. Since variation in the dispersion of phosphor in the fluorescent layer largely influences the emission characteristics of the LED device, a highly precise application technique and a high quality of material are required. Since larger quantities of resin and phosphor are contained in the LED of the second embodiment than in the LED of the first embodiment due to the fact that the volume of the sealed-type LED is bigger, the ratio of the content of resin to that of phosphor varies only to a small degree in the second embodiment. Further, the second embodiment is also more convenient in view of productivity. In the first embodiment, the process of adhering a film to a small light-emitting element is cumbersome and causes an increase in the defect rate. On the other hand, since the LED devices generally distributed on the market are the sealed-type, as in second embodiment, it is sufficient to add the phosphor to the sealing material in the manufacturing process, and thus no new processing is required.

Figure 3:
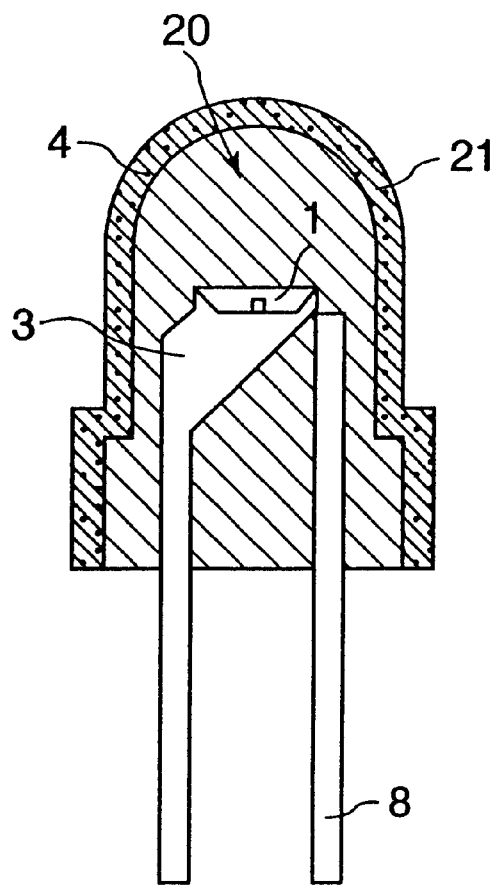
FIG. 3 is a diagram showing a structure of a cap-type LED device according to a third embodiment of the invention.
Figure 4:
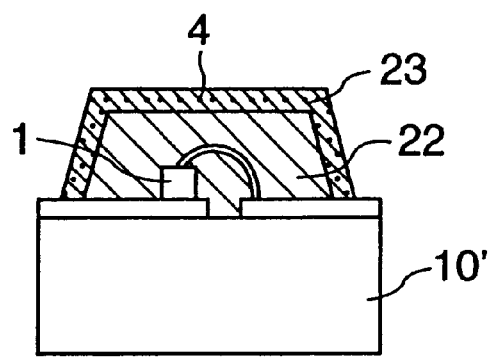
FIG. 4 is a diagram showing a structure of a block-type device according to a third embodiment of the invention.

In a third embodiment of the present invention, the light-emitting element is sealed with a transparent resin to form a sealed member, and the sealed member is covered with a covering member that includes the above-mentioned red phosphor. Specifically, as shown in FIG. 3, a sealed member 20 is formed by sealing the light-emitting element 1 placed in the cup 3 connected with the lead frame 8 and by covering this with a covering member 21 containing the phosphor 4. FIG. 4 shows an LED device where the sealed member is block-shaped. A covering member 23 used for covering the block-shaped sealed member 22 is formed so as to conform to the shape of the sealed member 22.

Figure 5:
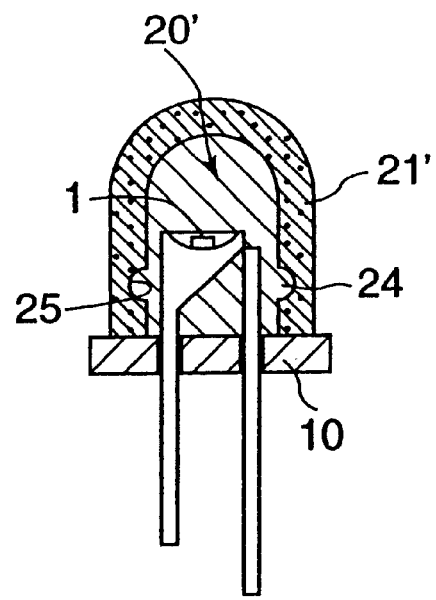
FIG. 5 is a diagram showing a construction of the LED device using a covering member having an engaging portion in the third embodiment.

The shape of the sealed member and the method of terminal connecting used in the third embodiment are not particularly limited. For example, as shown in FIG. 5, a sealed member 20' having a projecting locking portion 24 may be used, thereby accomplishing a stable mounting of covering member 21' onto sealed member 20'. The covering member 21' includes an engaging recess 25 engageable with the locking portion 24 of the sealed member 20'.

Figure 6:
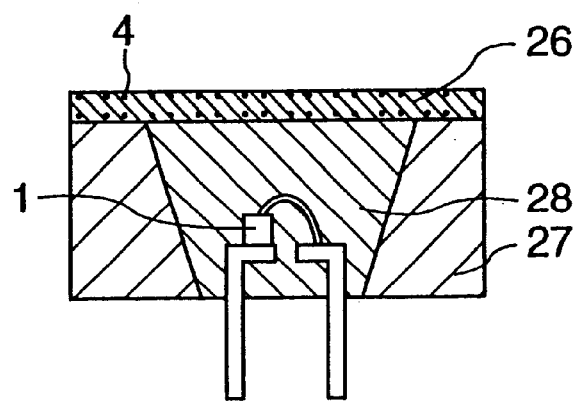
FIG. 6 is a diagram showing a construction of the LED device using a sheet-type covering member in the third embodiment.

Further, as shown in FIG. 6, the side wall of a sealed member 28 in which the light-emitting element 1 is embedded may be surrounded by a reflecting frame 27 to have a rectangular parallelepipedic or cylindrical shape, and a covering member containing the phosphor 4 may be arranged on the upper surface for transmitting the light from the light-emitting element 1.

The covering member is formed by molding a polymer composition comprising the red phosphor and a base polymer. The base polymer may be a transparent polymer having a good property of transmitting the light emitted from the light-emitting element and having durability, chemical resistance and insulating property if desired. Specifically, acrylic resin, polycarbonate, polystyrene, polyester, epoxy resin, polypropylene, polyethylene, silicone elastomer, polystyrene thermoplastic elastomer, polyolefin thermoplastic elastomer, polyurethane thermoplastic elastomer, etc. may be used as the base polymer. Among these materials, rubbers, elastomers and mixtures of these having an excellent elasticity are preferably used so as to provide a stable covering member which can be easily mounted on the sealed member to cover it and be difficult to detach.

As a material for the covering member, a preferable composition is such that the content of the red phosphor is 2 to 49 parts by mass with respect to 100 parts by mass of the base polymer. In the case of containing YAG in the covering member, a ratio of the content of YAG to that of the red phosphor (YAG: red phosphor) is preferably 1:0.2 to 1:4.

The covering member may take any shape that enables it to be mounted on the sealed member and have a light gathering mechanism at its leading end if necessary. Such a mechanism enables luminance to be increased and illumination action to be efficiently performed with a small amount of energy. The light gathering mechanism may be, for example, a lens structure in which thickness is larger at the leading end than at any other part.

In the case of a cap-shaped covering member, the covering member may be merely mounted on the sealed member. If the sealed member has an engaging portion, it becomes difficult to detach the covering member by engaging the covering member with the engaging portion. In the case of a sheet-shaped covering member, it is preferably secured to the sealed member by adhesion, heat fusion, ultrasonic bonding or the like.

In the case of the third embodiment of the present invention, the material for the sealed member does not need to contain phosphor and can be made of a transparent base resin. This allows a large variety of sealed members to be used and enables the color tone of light emitted from the light-emitting element to change easily. In other words, since the resin composition used for forming the sealed member has to be prepared for an entire lot at one time, the material and the color tone have to be changed on a large scale, too, a condition which is not suitable for production of many different products in small quantities. In this respect, the third embodiment has the advantage of easier production adjustment since the color tone of the LED device can be changed simply by changing the kind of covering member and, thus, the same material can be used for the sealed member.

EXAMPLES

Evaluation Method (1) Excitation Spectrum

An excitation spectrum (wavelength on horizontal axis, absorbancy on vertical axis) was measured using a spectral fluorescent photometer FP-750 (manufactured by Nippon Bunko K.K.).

(2) Emission Spectrum

An emission spectrum (wavelength on horizontal axis, emission intensity on vertical axis) in relation to a specified excitation wavelength was obtained using the spectral fluorescent photometer FP-750 (manufactured by Nippon Bunko K.K.).

(3) Emission Characteristics

CIE (International Committee on Illumination) chromaticity coordinates x, y and luminance L of a light diffusedly emitted from the LED device using a spectral radiation luminance meter PR704 (manufactured by Photo Research).

The higher the luminance, the brighter the light. The larger the values of the chromaticity coordinates, the more the color is away from white, i.e. a yellowish color.

(4) Color Rendering Property

Color rendering property was evaluated by the average color rendering evaluation number Ra and special color rendering evaluation numbers $R_9$ to $R_{15}$.

The average color rendering evaluation number Ra is a color rendering evaluation number corresponding to an average value of the special color rendering evaluation numbers of the specified eight test colors, whereas the special color rendering evaluation number ($R_i$) is a color rendering evaluation number obtained from a change of coordinates in a specified uniform color space when an object is illuminated by a reference light and when it is illuminated by a sample light source.

[Preparation of the Red Phosphor $LiEu_{(1-x)}Y_xW_2O_8$]

$Li_2O$, $Eu_2O_3$, $Y_2O_3$, and $WO_3$ were weighed to have a stoichimetric ratio and mixed in ethanol in a ball mill. By putting the mixture into an alumina crucible and baking it in an atmosphere of 2000° C. for 2 hours after being dried and crushed, $LiEuW_2O_8$, $LiEu_{0.7}Y_{0.3}W_2O_8$, $LiEu_{0.5}Y_{0.5}W_2O_8$, $LiEu_{0.3}Y_{0.7}W_2O_8$ and $LiEu_{0.1}Y_{0.9}W_2O_8$ were obtained.

Figure 7:
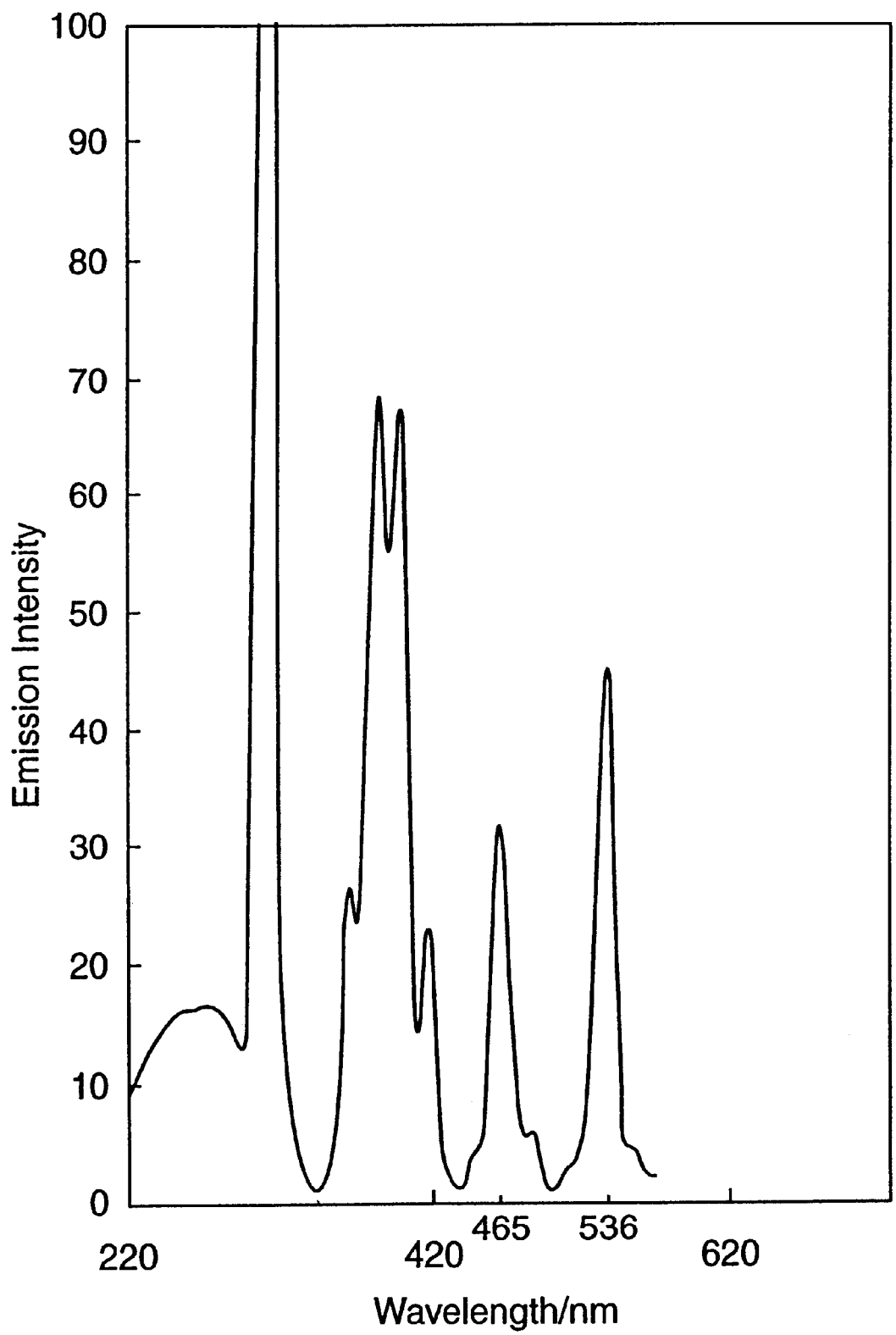
FIG. 7 is a graph showing an excitation spectrum and an emission spectrum of $LiEuW_2O_8$.

Measurements of an excitation spectrum of the $LiEuW_2O_8$ are shown in FIG. 7. Existence of excitation bands at 465 nm and 536 nm can be seen from FIG. 7. In other words, $LiEu_xLnW_2O_8$ compound can be found to be effective as a red phosphor for blue and green LED devices.

Figure 8:
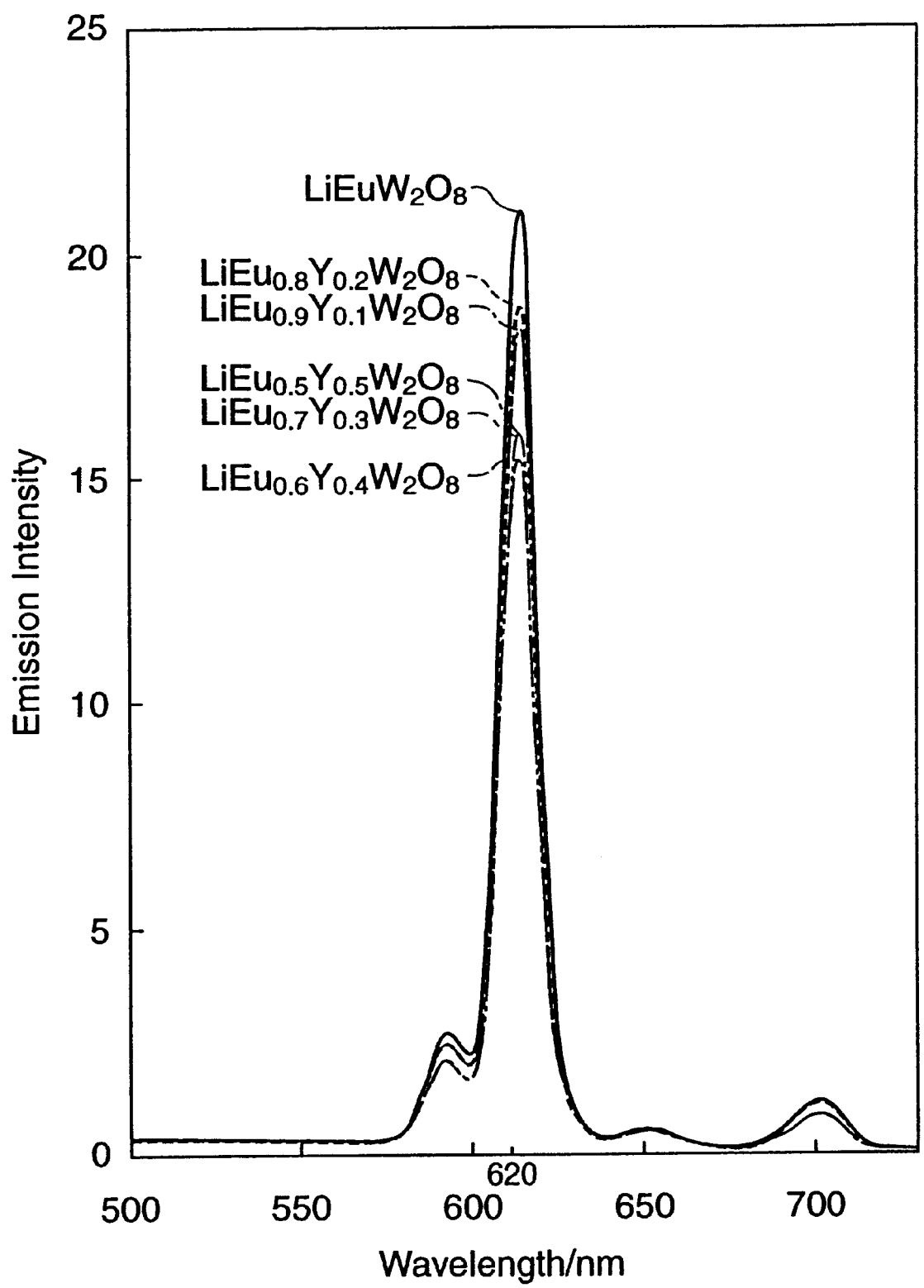
FIG. 8 is a graph of emission spectra showing a relationship between x in a $LiEu_{(1-x)}Y_xW_2O_8$ and emission intensity.

Next, emission characteristics of the above-prepared phosphors in the case of an excitation wavelength of 470 nm were measured. The obtained emission spectra are shown in FIG. 8. The horizontal axis and the vertical axis in FIG. 8 represent wavelength (nm) and emission intensity, respectively.

It can be seen from FIG. 8 that the emission intensity of the $LiEu_{(1-x)}Y_xW_2O_8$ compound near 620 nm was highest when x=0, i.e. $LiEuW_2O_8$.

[Preparation of the Red Phosphor $LiEu_{(1-x)}MoO_8$]

$Li_2O$, $Eu_2O_3$, and $MoO_3$ were weighed to have a stoichiometric ratio and mixed in ethanol in a ball mill. By putting the mixture into an alumina crucible and baking it in an atmosphere of 600° C. for 3 hours after being dried and crushed, a $LiEuMo_2O_8$ compound was obtained.

Figure 9:
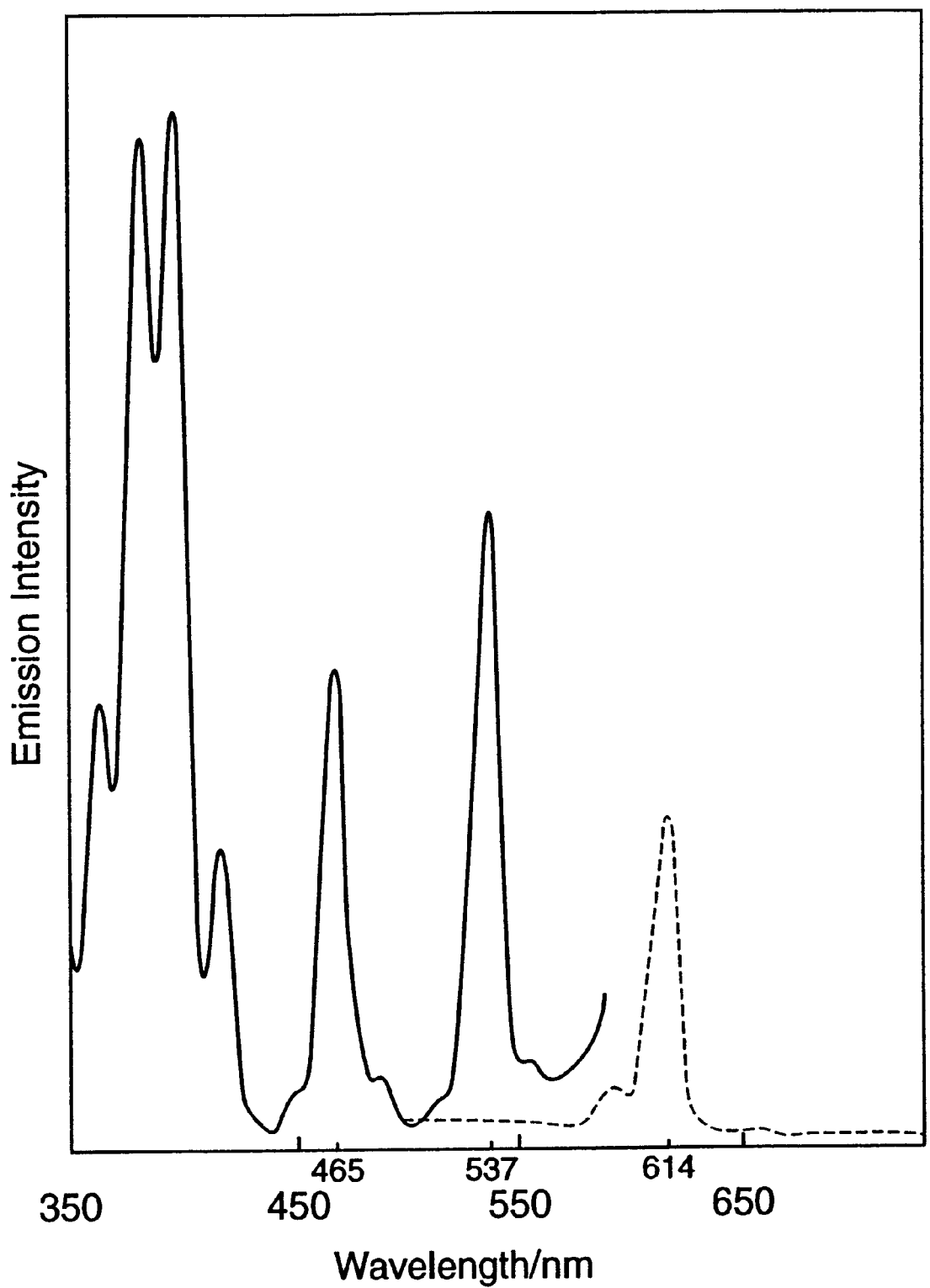
FIG. 9 is a graph showing an excitation spectrum and an emission spectrum of $LiEuMo_2O_8$.

Measurements of an excitation spectrum of $LiEuMo_2O_8$ and an emission spectrum thereof in the case of an excitation wavelength of 470 nm are shown in FIG. 9. In FIG. 9, the vertical axis and the horizontal axis represent absorbancy or emission intensity and wavelength (nm), respectively, and the solid and broken lines represent the excitation spectrum and the emission spectrum, respectively.

It can be seen from FIG. 9 that a red emission can be obtained at 614 nm by $^5D_0 \rightarrow ^7F_2$ transition of $Eu^{3+}$ ions similar to $LiEuW_2O_8$ compounds. Further, since the excitation wavelength is peaked at 465 nm and 537 nm, this compound can be used with not only blue LEDs, but also green LEDs.

[Relationship Between the Content of the Red Phosphor and an Emission Color of the LED Device]

Compositions for the covering member in which the content of $LiEu_{0.7}Y_{0.3}W_2O_8$ with respect to 100 parts by mass of silicone rubber were changed as shown in TABLE-1. Using these compositions, cap-shaped covering members having a thickness of 0.35 mm were molded. The covering members were mounted on a sealed member having an embedded blue light-emitting element and a sealed member having an embedded green light-emitting element. The resulting LED devices were turned on at 20 mA in an integrating sphere to measure emission colors. Measurement results are shown in TABLE-1.

TABLE 1

| Content of $LiEu_{0.7}Y_{0.3}W_2O_8$ (Parts by Mass) | Blue LED Chip | | | Green LED Chip | | |
|---|---|---|---|---|---|---|
| | X | y | Luminance | x | y | Luminance |
| 0 | 0.1277 | 0.0921 | 24.77 | 0.2060 | 0.6075 | 112.4 |
| 40 | 0.1371 | 0.1020 | 18.85 | 0.2174 | 0.6676 | 70.18 |
| 80 | 0.1435 | 0.1078 | 14.80 | 0.2264 | 0.6629 | 59.75 |
| 120 | 0.1472 | 0.1088 | 12.92 | 0.2322 | 0.6605 | 50.29 |

TABLE-1 shows that luminance decreases as the content of the phosphor with respect to 100 parts by mass of silicone rubber increases. However, the values of x and y increase as the content of the phosphor increases, indicating emission of a reddish light.

[Relationship Between the Content of the Red Phosphor and the Emission Color of the LED Device where a Plurality of Kinds of YAG Phosphors Exist]

Compositions for the covering members were prepared by adding 20 parts by mass of $Y_{1.8}Gd_{1.2}Al_5O_{12}$ in which 4 mol % of $Ce^{3+}$ ions were added to a host crystal and varying quantities of $LiEu_{0.7}Y_{0.3}W_2O_8$ with respect to 100 parts by mass of silicone rubber as shown in TABLE-2. Cap-shaped covering members having a thickness of 0.35 mm were formed using these compositions.

Figure 10:
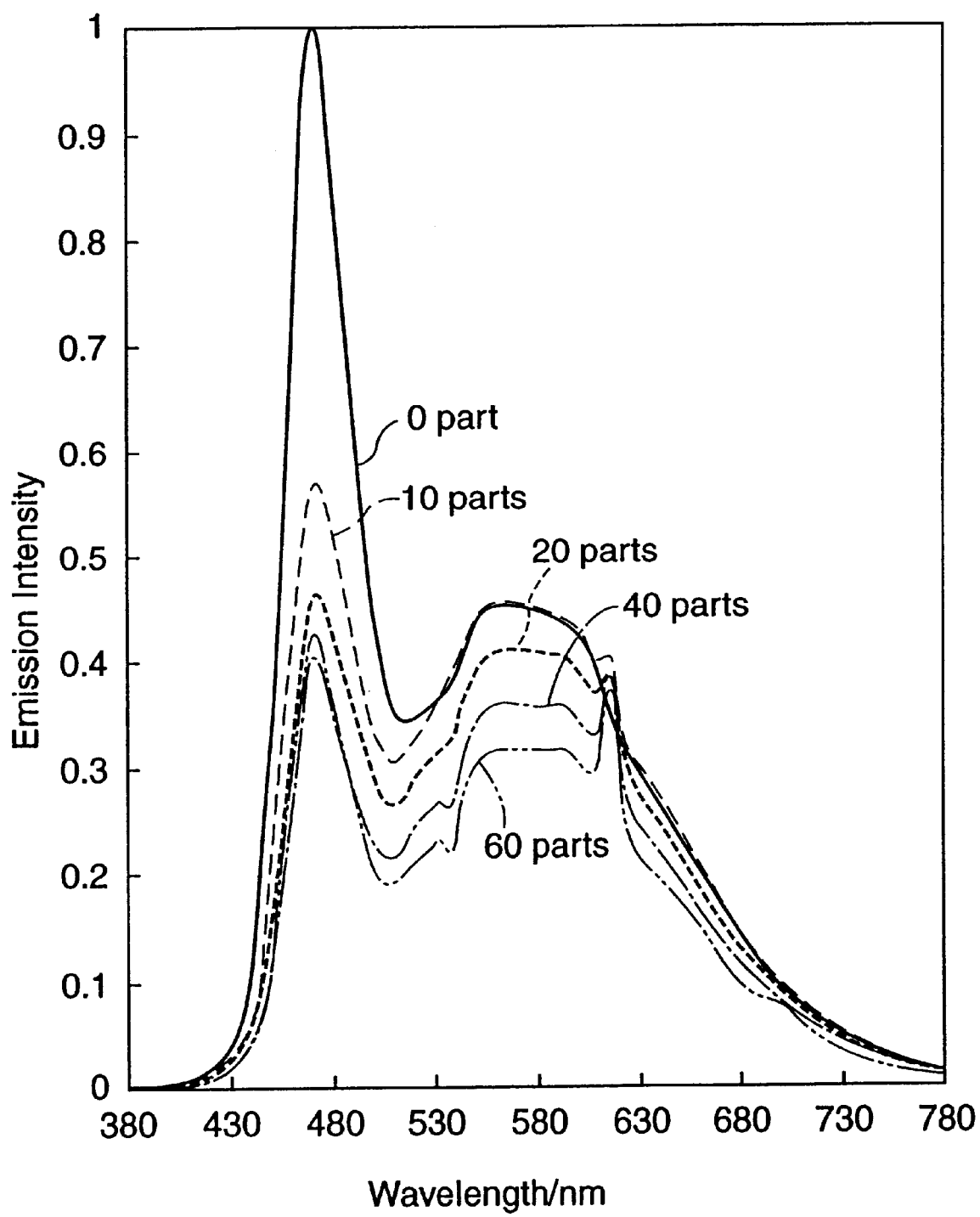
FIG. 10 is a graph of emission spectra showing a relationship between the content of a red phosphor and emission intensity.

The thus formed covering members were mounted on cannonball-shaped sealed members in which blue light-emitting elements (main emission wavelength of 468 nm) were embedded to produce white LED devices, and the emission spectra and the emission characteristics of the white LED devices were measured. The emission characteristics are shown in TABLE-2 and the emission spectra are shown in FIG. 10. It should be noted that emission intensity in FIG. 10 is a relative value on the assumption that emission intensity at 468 nm is 1 when the content of the red phosphor is 0.

TABLE 2

| Content of $LiEu_{0.7}Y_{0.3}W_2O_8$ | Blue LED Chip | | |
|---|---|---|---|
| (parts by mass) | x | y | Luminance |
| 0 | 0.3125 | 0.3381 | 54.25 |
| 10 | 0.3571 | 0.3909 | 51.79 |
| 20 | 0.3665 | 0.3981 | 46.39 |
| 30 | 0.3753 | 0.4039 | 43.77 |
| 40 | 0.3731 | 0.3971 | 40.17 |
| 50 | 0.3677 | 0.3868 | 36.01 |
| 60 | 0.3646 | 0.3810 | 35.71 |

As can be seen from TABLE-2, chromaticity shifts from white toward yellow up to the $LiEu_{0.7}Y_{0.3}W_2O_8$ content of 30 parts by mass, but conversely shifts toward white as the content exceeds 40 parts by mass. Further, luminance is found to decrease as the $LiEu_{0.7}Y_{0.3}W_2O_8$ content increases.

It can be seen from FIG. 10 that emission intensity at 468 nm is reduced by adding $LiEu_{0.7}Y_{0.3}W_2O_8$ and an emission peak of $LiEu_{0.7}Y_{0.3}W_2O_8$ by $^5D_0 \rightarrow ^7F_2$ transition is located at 616 nm. As the content of $LiEu_{0.7}Y_{0.3}W_2O_8$ increases, emission intensity at 468 nm decreases and emission intensity as a whole tends to decrease, while emission intensity at 616 nm increases. Specifically, the ratio $(I_a:I_b)$ of emission intensity $(I_a)$ at 468 nm to emission intensity $(I_b)$ at 616 nm was 1:0.5 to 1:2.

[Color Rendering Property of the LED Device]
LED Devices 1 and 2

Resin compositions for the covering members were prepared by adding a YAG phosphor in quantities shown in TABLE-3 to 100 parts by mass of silicone rubber as a base polymer, and covering members No. 1 and 2 having a thickness of 0.35 mm were molded. These covering members were mounted on sealed members in which blue light-emitting elements are embedded, and the color rendering property and emission characteristics of the thus formed LED devices 1 and 2 were measured. Measurement results are shown in TABLE-3.

A red YAG phosphor was used as the YAG phosphor.
LED Devices 3 to 5

Figure 11:
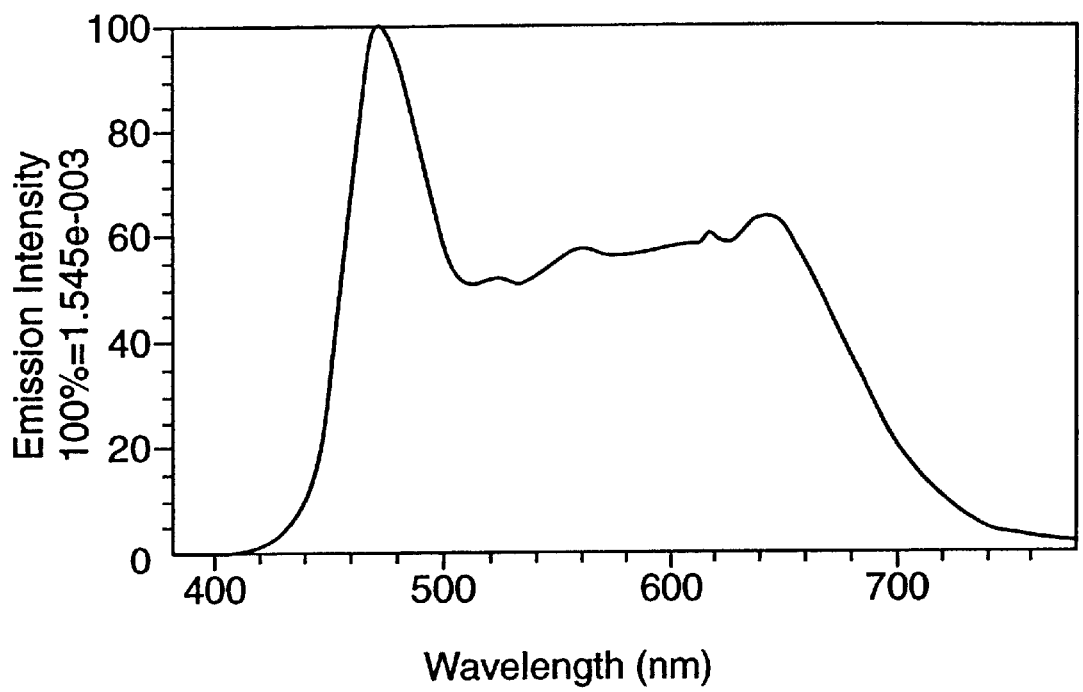
FIG. 11 is a graph showing an emission spectrum of a white LED device 4.
Figure 12:
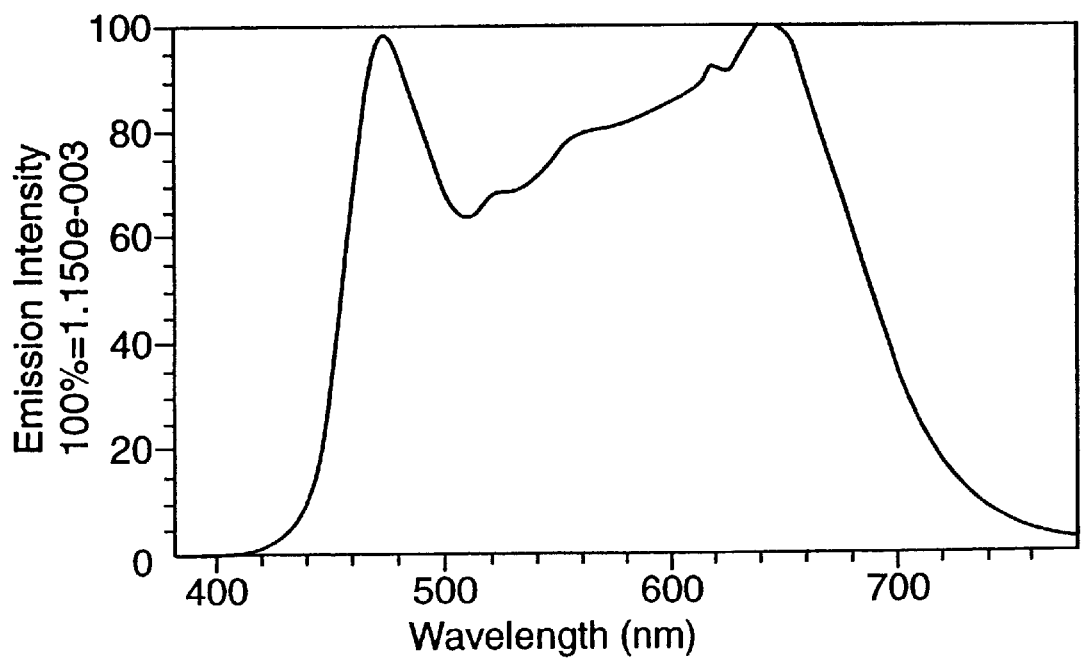
FIG. 12 is a graph showing an emission spectrum of a white LED device 5.

Resin compositions for the covering members were prepared by adding a YAG phosphor and CaS:Eu as a red phosphor in the quantities shown in TABLE-3 to 100 parts by mass of base polymer (silicone rubber), and covering members No. 3 to 5 having a thickness of 0.35 mm were molded. These covering members were mounted on sealed elements in which blue light-emitting elements were embedded, and the color rendering property and emission characteristics of the thus formed LED devices 3 to 5 were measured. Measurement results are shown in TABLE-3. Further, emission spectra of the LED devices 4 and 5 are shown in FIGS. 11 and 12.

A red YAG phosphor or green YAG phosphor was used as the YAG phosphor.
LED Device 6

Figure 13:
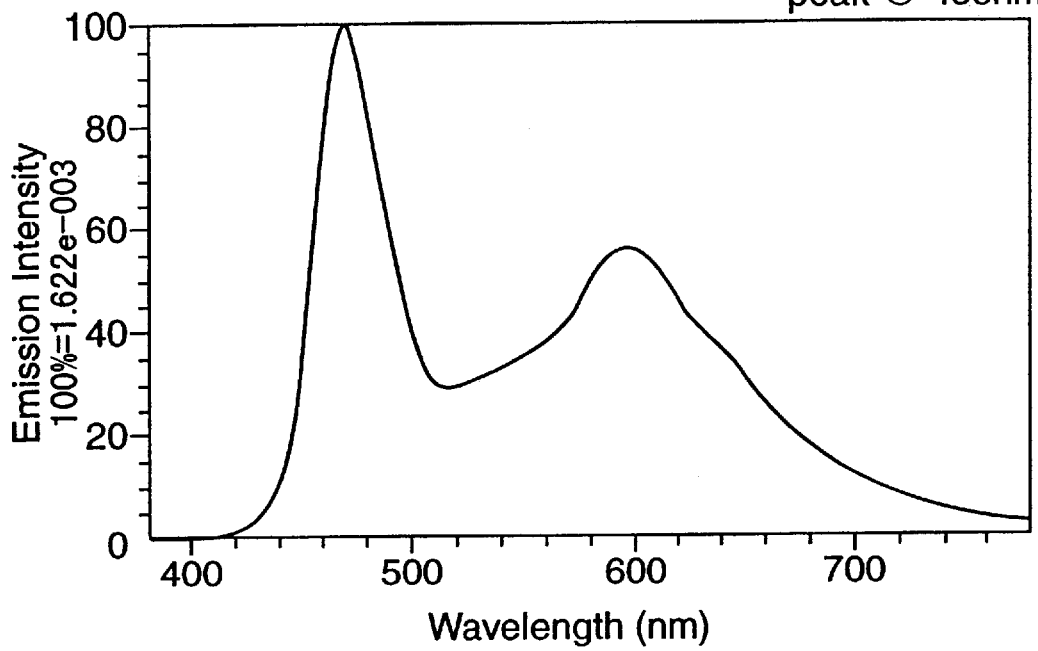
FIG. 13 is a graph showing an emission spectrum of a white LED device 6.

Resin compositions for the covering member were prepared by adding a YAG phosphor and a red azo pigment in quantities shown in TABLE-3 to 100 parts by mass of base polymer (silicone rubber), and a covering member No. 6 having a thickness of 0.35 mm was formed. This covering member was mounted on a sealed member in which a blue light-emitting element was embedded, and the color rendering property and emission characteristics of the thus formed LED device 6 were measured. Measurement results are shown in TABLE-3. Further, the emission spectrum of LED 6 is shown in FIG. 13.

LED Device 7

LED device 7 is a commercially available white LED device in which a fluorescent layer containing YAG is placed on a blue light-emitting element and these two as a whole are sealed with a resin to form a cannonball shape. It should be noted that the kind of blue light-emitting element used in the LED device 7 is different from the one used in the white LED devices 1 to 6.

Figure 14:
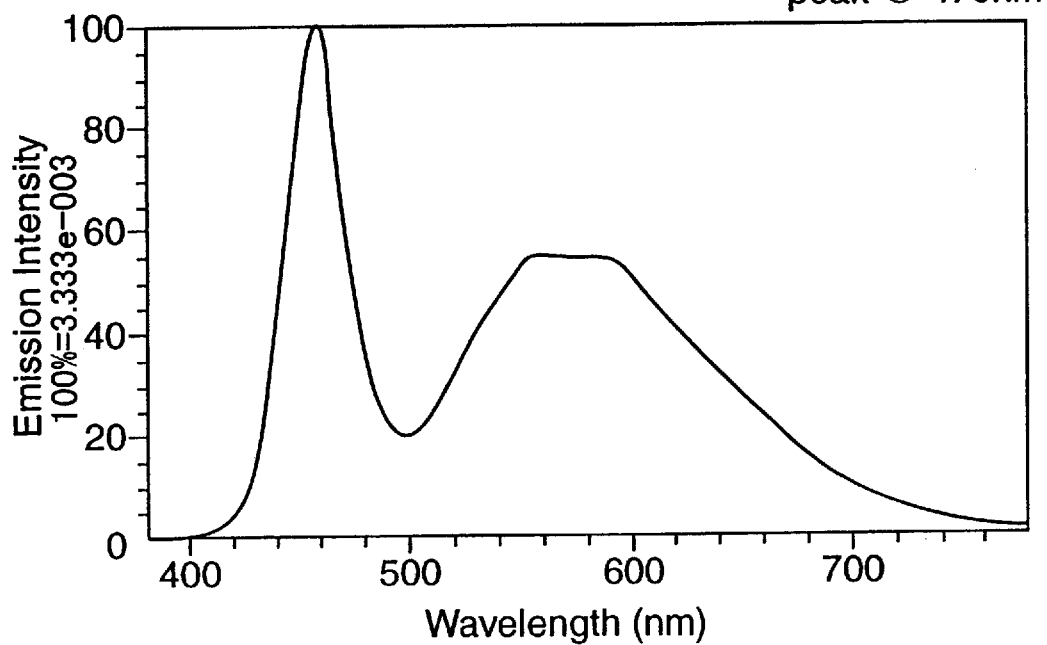
FIG. 14 is a graph showing an emission spectrum of a white LED device 7.

Measurement results of the color rendering property and emission characteristic of this white LED device are shown in TABLE-3, and an emission spectrum thereof is shown in FIG. 14.

It should be noted that the vertical axis in FIGS. 11 to 14 represents a relative emission intensity when the emission intensity of blue (FIGS. 11, 13, 14) or red (FIG. 12) light at an emission peak is assumed to be 100.

attained, and a yellow light emitted from YAG becomes excessively strong, thereby significantly reducing the special color rendering evaluation number $R_9$, which is an index for distinct red. On the other hand, the inventive white LED devices attained an average color rendering evaluation number Ra of 85 or larger independently of the kind of the YAG phosphor used and presented an excellent color rendering property without significantly reducing the values of the special color rendering evaluation numbers $R_9$ to $R_{15}$. Specifically, the inventive white LED devices had better color rendering property than the LED devices 1 and 2 in which the red YAG was used, the LED device 6 in which the red pigment was used, and the commercially available LED device 7. Since the red pigment was added in the covering member of the LED device 6, the special color rendering evaluation number $R_{10}$, which is an index for yellow, was significantly reduced, and luminance was reduced due to the influence of the pigment, even though the value of the special color rendering evaluation number $R_9$, which is an index for distinct red, was increased.

TABLE 3

| NO. | | 1 | 2 | 3 | 4 | 5 | 6 | 7 |
|---|---|---|---|---|---|---|---|---|
| Composition (Parts by Mass) | Base Polymer | 100 | 100 | 100 | 100 | 100 | 100 | Commercially available product |
| | Red YAG | 14.2 | 19.7 | 19.4 | — | — | — | |
| | Green YAG | — | — | — | 8.8 | 10.8 | 12.8 | |
| | CaS:Eu | — | — | 4.3 | 8.9 | 11.0 | — | |
| | Red Pigment | — | — | — | — | — | 0.1 | — |
| Evaluation | Ra | 75.4 | 83.6 | 87.3 | 85.2 | 88.9 | 72.4 | 74.9 |
| | $R_9$ | 87 | 45 | 71 | 96 | 96 | 88 | 85 |
| | $R_{10}$ | 55 | 93 | 91 | 74 | 85 | 44 | 63 |
| | $R_{11}$ | 66 | 69 | 75 | 81 | 83 | 71 | 59 |
| | $R_{12}$ | 61 | 74 | 74 | 77 | 80 | 54 | 57 |
| | $R_{13}$ | 84 | 95 | 98 | 93 | 95 | 80 | 87 |
| | $R_{14}$ | 85 | 92 | 94 | 89 | 94 | 81 | 87 |
| | $R_{15}$ | 82 | 87 | 93 | 90 | 90 | 84 | 80 |
| | Luminance L | 68.19 | 71.90 | 66.68 | 63.64 | 65.18 | 49.71 | 111.90 |
| | Chromaticity Coordinate x | 0.3368 | 0.3678 | 0.3900 | 0.3486 | 0.3848 | 0.3394 | 0.3285 |
| | Chromaticity Coordinate y | 0.3326 | 0.3655 | 0.3665 | 0.3646 | 0.3904 | 0.3255 | 0.3166 |

In FIG. 13, a peak, which shows emission intensity of about 60% of blue light, is seen at 580 to 600 nm in addition to the peak at 458 nm, which is the wavelength of the light from the light-emitting element and of an amount of light with a reduced wavelength near 500 nm due to the use of the red YAG. FIG. 14 shows an emission spectrum in the case when a red pigment was used. Although the spectrum pattern thereof is similar to the one shown in FIG. 13, emission intensity is reduced as a whole in the case when pigment is used, as can been seen from the fact that intensity is 100% at $3.3 \times 10^{-3}$ in FIG. 13, while it is only at $1.62 \times 10^{-3}$ in FIG. 14.

On the other hand, FIGS. 11 and 12 show emission spectra of an LED device according to the present invention, in which a peak is seen near 650 nm and intensity at this peak is 60% or more of that of the peak of blue light. Further, no fall in the emission intensity to around 500 nm as shown in FIG. 13, 14 was observed. In other words, with the LED device of the present invention, average emission was made in a range between 400 nm and 700 nm, indicating an improvement in color rendering property.

Such an improvement in color rendering property is also clear from TABLE-3, since only the inventive white LED devices containing the specific red phosphors had an average color rendering evaluation number Ra of 85 or larger.

Specifically, even if the content of the red YAG phosphor is increased as in the LED device 2, an average color rendering evaluation number Ra of 85 or larger cannot be Although luminance was substantially higher in the commercially available LED device 7, this is thought to be based on a difference between the embedded blue light-emitting elements.

As described above, the inventive light-emitting diode has a better red emission than the conventional light-emitting diodes using a light-emitting element for emitting light in the blue to green region. Accordingly, the inventive white LED device in which YAG phosphor is added in the fluorescent substance has a color rendering property approximate to that of a fluorescent lamp or natural light. Further, if the inventive covering member is mounted on a conventional light-emitting diode device, the inventive white LED devices having excellent color rendering property can be obtained.

This application is based on Japanese Application No. 2000-70878 filed in Japanese Patent Office on Mar. 14, 2000, the contents of which are hereby incorporated by reference.

Although the present invention has been fully described by way of example with reference to the accompanying drawings, it is to be understood that various changes and modifications will be apparent to those skilled in the art. Therefore, unless such changes and modifications otherwise depart from the scope of the present invention hereinafter defined, they should be construed as being included therein.

What is claimed is:

1. A light-emitting diode device, comprising
a light-emitting element for emitting light of blue to green region and
a fluorescent substance containing a phosphor expressed by a general formula $AEu_{(1-x)}Ln_xB_2O_8$ for converting a wavelength of the light emitted from the light-emitting element, wherein A is an element selected from the group consisting of Li, K, Na and Ag; Ln is an element selected from the group consisting of Y, La and Gd; and B is W or Mo; and x is number equal to or larger than 0, but smaller than 1.

2. The light-emitting diode device according to claim 1, wherein the light-emitting element emits light having a wavelength of 400 nm to 600 nm.

3. The light-emitting diode device according to claim 1, wherein the fluorescent substance further contains a $Y_xGd_{3-x}Al_5O_2$ ($0 \leq x \leq 3$) phosphor activated by Ce.

4. The light-emitting diode device according to claim 3, wherein the light-emitting diode device has an average color rendering evaluation number (Ra) of 85 or larger.

5. The light-emitting diode device according to claim 3, wherein the light-emitting diode device has a special color rendering evaluation number $R_9$ of 80 or larger.

6. The light-emitting diode device according to claim 2, wherein a ratio ($I_a:I_b$) of emission intensity ($I_a$) of light having 470 nm±2 mn to emission intensity ($I_b$) of light having 610 to 640 nm is 1:0.5 to 1:2.

7. The light-emitting diode device according to claim 1, wherein the fluorescent substance is in the form of a layer placed on an outer surface of the light-emitting element.

8. The light-emitting diode device according to claim 1, wherein the fluorescent substance is made of a transparent resin containing the $AEu_{(1-x)}Ln_xB_2O_8$ phosphor and seals the light-emitting element.

9. The light-emitting diode device according to claim 1, wherein the light-emitting element is sealed with a transparent resin to form a sealed member, the sealed member is covered with a covering member including the fluorescent substance.

10. The light-emitting diode device according to claim 9, wherein the covering member is made from a polymer composition containing 100 parts by mass of a base polymer, 2 to 40 parts by mass of a phosphor expressed by $AEu_{(1-x)}Ln_xB_2O_8$, and a $Y_xGd_{3-x}Al_5O_{12}$ phosphor activated by Ce.

11. The light-emitting diode device according to claim 10, wherein the base polymer comprises a rubber and/or a thermoplastic elastomer.

12. The light-emitting diode device according to claim 9, wherein the covering member is made from a polymer composition containing 100 parts by mass of a base polymer, 2 to 40 parts by mass of the $AEu_{(1-x)}Ln_xB_2O_8$ phosphor, and a $Y_xGd_{3-x}Al_5O_{12}$ phosphor activated by Ce.

13. The light-emitting diode device according to claim 12, wherein the base polymer comprises a rubber and/or a thermoplastic elastomer.

14. A covering member for covering a light-emitting diode device which includes a light-emitting element sealed by a transparent resin for emitting light in a blue to green region, comprising
a base polymer, and
a phosphor expressed by $AEu_{(1-x)}Ln_xB_2O_8$ wherein A is an element selected from the group consisting of Li, K, Na, and Ag; Ln is an element selected from the group consisting of Y, La and Gd; and B is W or Mo; and x is a number equal to or larger than 0, but smaller than 1.

15. The covering member according to claim 14, further comprising a $Y_xGd_{3-x}Al_5O_{12}$ phosphor activated by Ce.

* * * * *